United States Patent
Zampaglione et al.

(10) Patent No.: US 9,762,261 B2
(45) Date of Patent: Sep. 12, 2017

(54) ERROR DETECTION AND CORRECTION IN TERNARY CONTENT ADDRESSABLE MEMORY (TCAM)

(71) Applicant: eSilicon Corporation, San Jose, CA (US)

(72) Inventors: Michael Anthony Zampaglione, San Jose, CA (US); Thomas Robert Wik, Livermore, CA (US)

(73) Assignee: eSilicon Corporation, San Jose, CA (US)

(*) Notice: Subject to any disclaimer, the term of this patent is extended or adjusted under 35 U.S.C. 154(b) by 21 days.

(21) Appl. No.: 14/502,954

(22) Filed: Sep. 30, 2014

(65) Prior Publication Data
US 2015/0095738 A1 Apr. 2, 2015

Related U.S. Application Data

(60) Provisional application No. 61/884,689, filed on Sep. 30, 2013.

(51) Int. Cl.
G11C 29/00 (2006.01)
H03M 13/09 (2006.01)
H03M 13/13 (2006.01)
G06F 11/10 (2006.01)
H03M 13/19 (2006.01)

(52) U.S. Cl.
CPC ......... *H03M 13/09* (2013.01); *G06F 11/1064* (2013.01); *H03M 13/13* (2013.01); *H03M 13/19* (2013.01)

(58) Field of Classification Search
None
See application file for complete search history.

(56) References Cited

U.S. PATENT DOCUMENTS

| | | | | |
|---|---|---|---|---|
| 7,170,769 B1 * | 1/2007 | Sachan | ................ | G11C 15/04 365/168 |
| 7,254,748 B1 * | 8/2007 | Wright | ............... | G06F 11/1064 711/108 |
| 7,304,874 B2 * | 12/2007 | Venkatraman | ......... | G11C 15/04 257/E21.661 |
| 7,570,503 B1 * | 8/2009 | Maheshwari | .......... | G11C 15/04 365/154 |
| 2007/0061692 A1 * | 3/2007 | Wickeraad | .......... | G06F 11/1064 714/801 |
| 2007/0061693 A1 * | 3/2007 | Wickeraad | ............. | G11C 15/04 714/801 |
| 2015/0095740 A1 * | 4/2015 | Zampaglione | ...... | G06F 11/1068 714/764 |

* cited by examiner

Primary Examiner — Daniel McMahon
(74) Attorney, Agent, or Firm — Fenwick & West LLP (57) ABSTRACT

A ternary content addressable memory (TCAM) is disclosed. The TCAM includes a memory array, a data match module, and compare circuitry. The memory array stores a data entry for a data word and a corresponding duplicate data entry for the data word. The data match module compares the data entry to an input word to produce a first match output, and compares the duplicate data entry to the input word to produce a second match output. The compare circuitry compares the first match output and the second match output.

18 Claims, 5 Drawing Sheets

ERROR DETECTION AND CORRECTION IN TERNARY CONTENT ADDRESSABLE MEMORY (TCAM)

CROSS REFERENCE TO RELATED APPLICATIONS

This application claims the benefit of U.S. Provisional Application No. 61/884,689, filed Sep. 30, 2013, which is incorporated by reference in its entirety.

BACKGROUND OF THE INVENTION

1. Field of the Invention

This invention relates generally to content addressable memory (CAM). More particularly, it relates to real-time error detection and/or correction in ternary content addressable memory (TCAM).

2. Description of the Related Art

Content addressable memory (CAM) is a type of memory unit in which the data stored is addressable by its content. During a compare operation, the CAM compares an input word with the words stored in the CAM. The CAM determines whether each entry is a match or a mismatch to the input word. If a match to the input word is found, the CAM may return a list of one or more storage addresses of the entries that matched the input word and/or one or more data words associated with the entries that matched the input word.

A ternary CAM (TCAM) is a type of CAM in which the bits stored in a data entry can have three different values for purposes of matching to the input word (e.g., 1, 0, and X or don't care). Some TCAMs implement the third bit value by adding a mask bit for every bit in the data word, where the mask bit specifies whether the corresponding bit in the data word is an X (i.e., whether a bit in the data entry is a "care" or "don't care").

Errors may be introduced into entries in a TCAM (e.g., by ionizing radiation). In certain applications, the soft error rates (SER) in TCAMs can exceed acceptable limits for many applications given the large number of bits stored by TCAMs.

SUMMARY OF THE INVENTION

The present invention overcomes the limitations of the prior art by providing error correction circuitry and/or duplicate entries to entries in a TCAM. When performing a compare operation in a TCAM, the results of the compare operation of an entry can be compared to the results of the compare operation of the corresponding duplicate entry. If a mismatch is observed, the TCAM determines that an error may be present in the entry and/or duplicate entry. The TCAM or other external circuitry can then perform actions to correct the error. Once the error is corrected, the TCAM may complete the compare operation with the correct data entry.

The error correction circuitry can be used to correct errors in an entry of the TCAM. Depending on the error correcting code used by the TCAM, single bit errors or multiple bit errors may be detected and/or corrected without the need of retrieving the data to be corrected from an external source.

BRIEF DESCRIPTION OF THE DRAWINGS

The invention has other advantages and features which will be more readily apparent from the following detailed description of the invention and the appended claims, when taken in conjunction with the accompanying drawings, in which:

DETAILED DESCRIPTION OF THE PREFERRED EMBODIMENTS

Figure 1A:
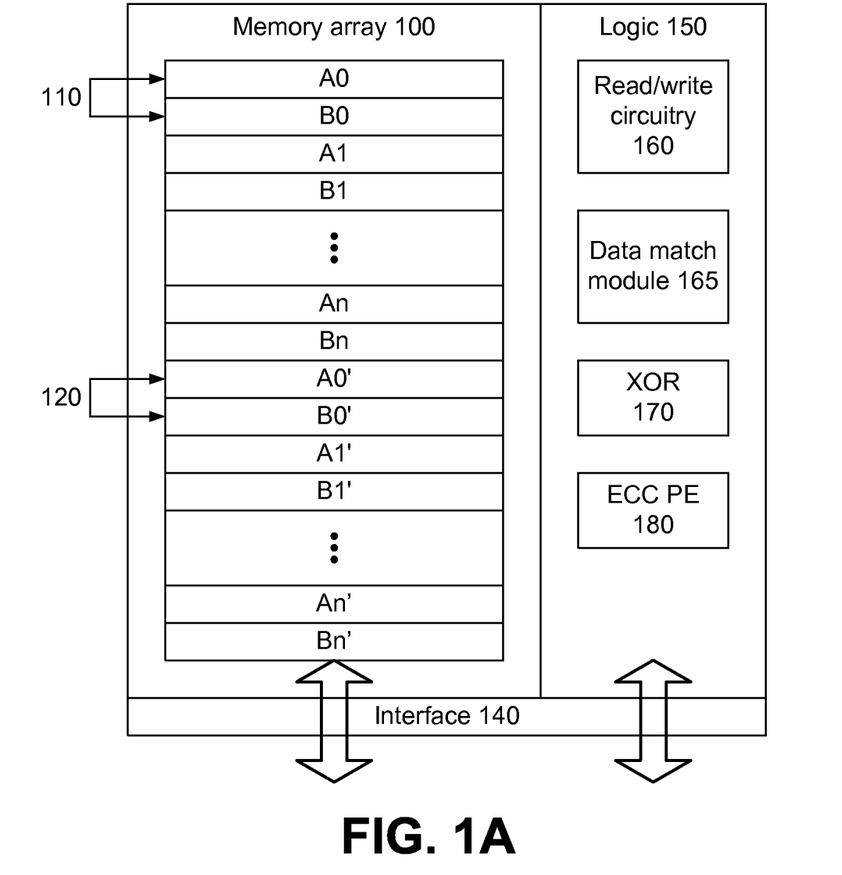
FIG. 1A is a block diagram of a ternary content addressable memory (TCAM) with duplicate entries, according to one embodiment of the invention.

FIG. 1A is a block diagram of a ternary content addressable memory (TCAM) with duplicate entries, according to one embodiment of the invention. The TCAM of FIG. 1A includes a memory array 100, logic circuitry 150 and an interface 140. The memory array 100 contains data organized as words (which are shown as rows in FIG. 1A). The logic 150 contains auxiliary circuitry for the TCAM. The interface 140 provides an interface for communication between the TCAM and other components.

For purposes of illustration, assume that the TCAM is used to store 144-bit data word D. Since each bit can take one of three states (0, 1, X) for purposes of the TCAM, each data entry in the TCAM occupies two rows, denoted as A and B in FIG. 1A. Thus, 144-bit data word D0 is stored as a data entry 110 in the TCAM that includes 144-bit row A0 and 144-bit row B0, data D1 is stored as a data entry that includes 144-bit row A1 and 144-bit row B1, and so on.

The two rows A and B can be mapped to the three states 0,1,X in different ways. In one approach, row A contains the actual data word D and row B contains corresponding mask bits. Table 1 shows this mapping. When the mask bit is off (B=0), then no masking occurs and the data (A=0 or A=1) is used for purposes of TCAM comparison. When the mask bit is on (B=1), then the corresponding data bit is ignored for purposes of TCAM comparison.

TABLE 1

| A, B Encoding | | |
| --- | --- | --- |
| A (data) | B (mask) | state |
| 0 | 0 | 0 |
| 1 | 0 | 1 |
| 0 | 1 | X |
| 1 | 1 | X |

Table 2 shows an alternate approach to map A and B bits of a data entry to the TCAM comparison state.

TABLE 2

Alternate A, B Encoding

| A | B | state |
|---|---|---|
| 0 | 1 | 0 |
| 1 | 0 | 1 |
| 0 | 0 | X |
| 1 | 1 | not used |

In FIG. 1A, the memory array 100 also stores duplicate entries 120 of the A and B entries. The duplicate entries are denoted by the ' symbol. Thus, A0' and B0' are duplicate entries of A0 and B0, respectively. A1' and B1' are duplicate entries of A1 and B1, and so on. FIG. 1A shows a logical arrangement of the memory array. Different physical layouts are possible. For example, in some embodiments, to decrease the likelihood of both the data entry 110 and the duplicate data entry 120 being affected by the same ionizing radiation event, the duplicate entry 120 is physically separated from the corresponding base entry 110 by at least a minimum spacing (e.g., separated by at least four entries).

The logic 150 includes read/write circuitry 160, a data match module 165, XOR circuitry 170 (or other compare circuitry), and an error correction code priority encoder (ECC PE) 180. The read/write circuitry 160 reads data from the memory array 100 and writes data to the memory array 100, via the interface 140. The read/write circuitry 160 may also read and write data not shown in FIG. 1A. For example, data entry 110 may be an index to other data words. The read/write circuitry 160 may also read and write those other data words.

In the example shown in FIG. 1A, assume that the TCAM requires one cycle to read one physical 144-bit word and one cycle to write one physical 144-bit word. In that case, writing a data entry 110 and its duplicate entry 120 would require four cycles, one each to write A0, B0, A0' and B0'. Reading the data entry would require four cycles, two cycles to read a data entry 110 and two cycles to read its duplicate entry 120. In an alternate embodiment, the TCAM is designed so that 144-bit words are stored into corresponding rows simultaneously. That is, writing data to A0 would also automatically write the same data to A0' during the same cycle. In that case, writing a data entry 110 and its duplicate entry 120 would require only two cycles. Reading the data stored in data entry 110 would require two cycles, because the base data is only 144 bits.

The content comparison function of the TCAM is performed by the data match module 165. The data match module 165 compares the data entries 110 to an input word, taking into account both the data and the mask stored in the data entry 110. In some embodiments, the data match module 165 compares an input word to every data entry 110 of the TCAM in parallel and generates a match output for every data entry 110 indicating whether the input word matched the data entry. The data match module 165 also compares an input word to the duplicate data entries 120 and generates match outputs for the duplicate data entries.

Figure 1B:
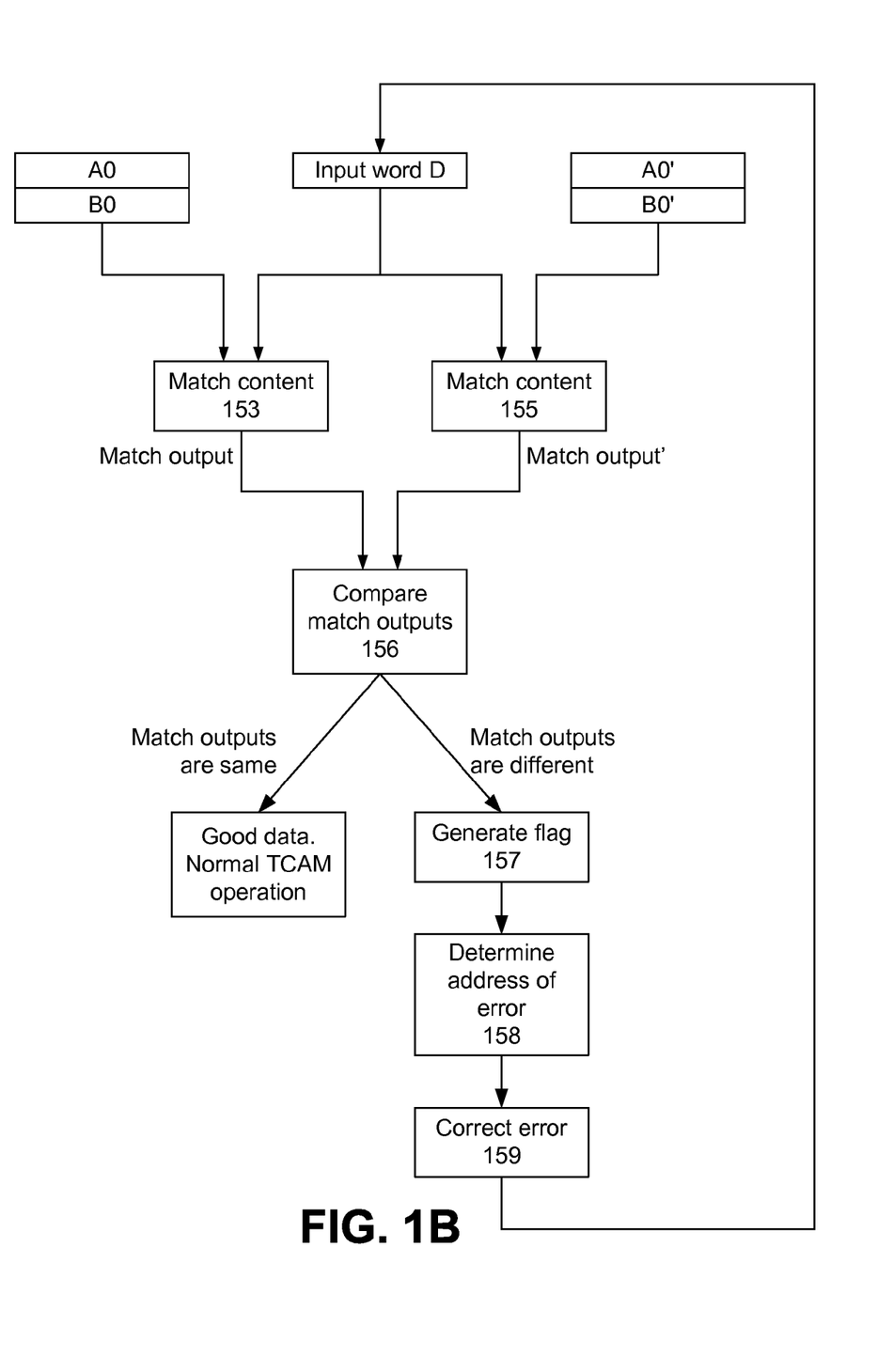
FIG. 1B is a flow chart showing steps for determining in real-time, whether an entry in a TCAM is corrupted, according to one embodiment of the invention.

The duplicate data entries can be used to facilitate the real-time detection of errors in the memory array 100, as shown in FIG. 1B. This might occur, for example, if bits are flipped due to ionizing radiation. In FIG. 1B, input word D is received by the TCAM. It is compared 153 to a data entry (A0, B0, for example) and also compared 155 to its corresponding duplicate data entry (A0', B0').

The outputs of the two compare operations 153,155 are compared 156 by the XOR 170 to determine whether the two match operations 153,155 produced the same result. Since the data entry 110 and corresponding duplicate data entry 120 should be the same, the outputs of their compare operations to the input word should also be the same. If XOR determines that this is the case, then the TCAM can operate as normal since the data entries are good. Otherwise, if the XOR 170 determines that there is a mismatch between the outputs of the two compare operations, a flag may be set 157 indicating the presence of an error in either the data entry 110 or in the corresponding duplicate data entry 120.

Additionally, the ECC PE 180 may determine 158 the address of the inconsistent compare operation result. That is, ECC PE 180 determines the address of the (A0, B0) and (A0', B0') so that the inconsistency can be resolved. In one approach, the address determined by the ECC PE 180 is used to correct 159 the detected error. For example, the uncorrupted data may be retrieved from an external data source and reloaded to the data entry 110 and the corresponding duplicate data entry 120. The TCAM content compare can then be run again against the good data entries. The TCAM can be designed so that flagging 157 a possible error occurs as part of the TCAM content comparison function. In this way, possible errors are flagged early, which leads to earlier correction of those errors. This in turn reduces the delay in completing the TCAM content comparison function.

Figure 2:
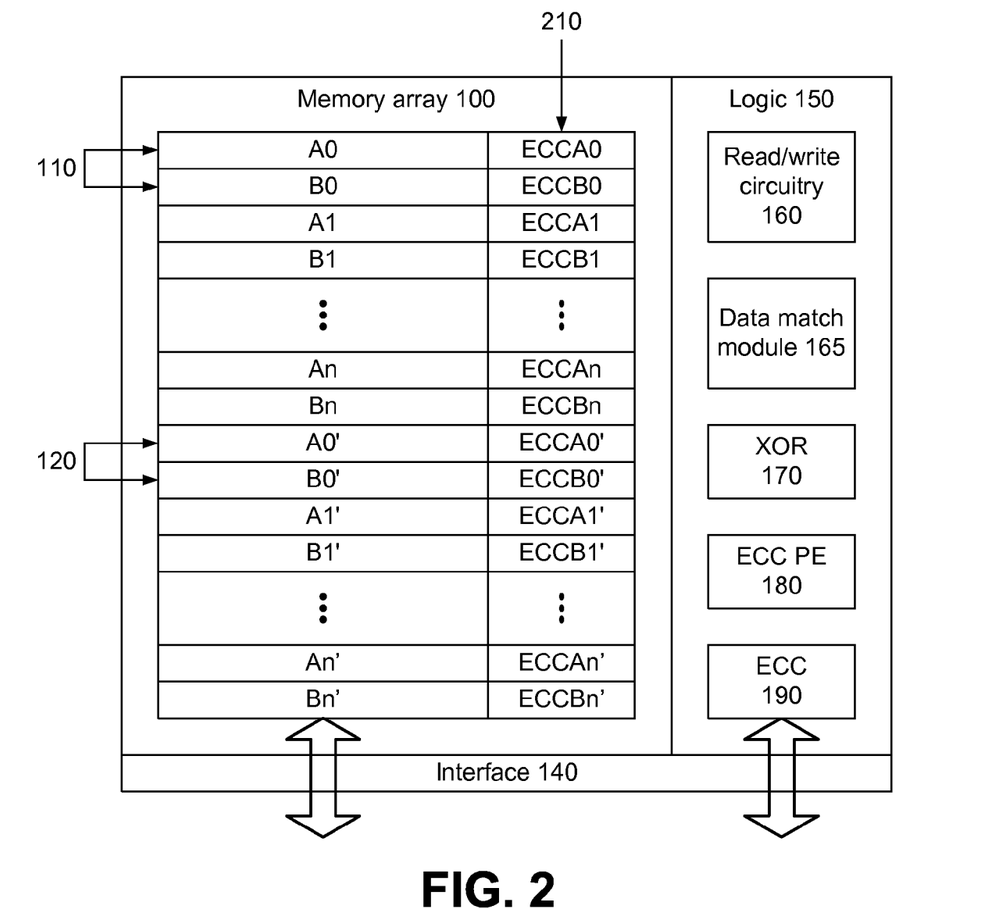
FIG. 2 is a block diagram of a TCAM with duplicate entries and error correction, according to one embodiment of the invention.

FIG. 2 is a block diagram of a TCAM with duplicate entries and error correction, according to one embodiment of the invention. The TCAM of FIG. 2 is similar to that shown in FIG. 1A, except that it also includes error correction within the TCAM. The logic 150 additionally includes error correction code (ECC) circuitry 190, which implements the error correction. The memory array further stores ECC data 210 corresponding to the data entries 110,120. In the example shown in FIG. 2, the ECC data ECCA0 corresponds to row A0, ECCB0 corresponds to row B0, etc.

If the main data is 144 bits and Hamming code correction is used, then the ECC data may be 9 bits. Thus, 9-bit Hamming code ECCA0 is calculated by ECC circuitry 190 for 144-bits of row A0, 9-bit Hamming code ECCB0 is calculated by ECC circuitry 190 for 144-bits of row B0, and so on, including for the duplicate entries 120. By using Hamming codes, the ECC circuitry 190 may be able to correct one bit errors and detect two bit errors. In other embodiments, other error correcting codes that are capable of detecting and/or correcting one or more bit errors may be used.

The write, compare and read functions of the TCAM in FIG. 2 may be modified relative to the TCAM in FIG. 1A, in the following ways. Upon writing data to the memory array 100, the ECC circuitry 190 calculates the corresponding EEC data 210 which is also stored in the memory array. For example, when the 144 bits of row A0 are written to the memory array 100, the ECC circuitry 190 calculates the 9 bit Hamming code which is written as ECCA0 to the memory array.

Upon readout, data may be read out in the same fashion as previously. Alternately, the ECC code 210 can also be checked as part of readout. For example, upon readout of row A0, that data may be checked by the ECC circuitry 190 against ECCA0 to confirm the integrity of the data. If an error is indicated, the ECC circuitry 190 may be able to correct the error (e.g., in the case of 1-bit errors for the Hamming code example) or may simply flag the error for correction elsewhere.

In one approach, the content compare function for the TCAM proceeds initially in the same manner as for the TCAM of FIG. 1A, for example according to FIG. 1B. An input word D is matched against a data entry (A0, B0) and against its duplicate entry (A0', B0'). However, unlike in FIG. 1A, if the two matches have different results, the error may be corrected (step 159 of FIG. 1B) internally within the TCAM in certain instances. The ECC circuitry 190 may perform a scrub operation to correct or detect the error. For example, rows A0, B0, A0', B0' may be checked by the ECC circuitry 190 against their corresponding error codes ECCA0, ECCB0, ECCA0', ECCB0' to correct and/or identify errors. The TCAM may be designed so that these checks proceed in parallel. If the encoding/decoding of error bits takes a long time, these operations may also be pipelined.

In some embodiments, the ECC circuitry 190 determines whether a correctable error exists in rows A0, B0, A0', B0' using their corresponding error codes ECCA0, ECCB0, ECCA0', ECCB0'. For instance, a correctable error is a 1-bit error for the Hamming code described hereinabove. If the ECC circuitry 190 determines that one or more rows A0, B0, A0', B0' contain a correctable error, the ECC circuitry 190 corrects the row using the corresponding error code.

The ECC circuitry 190 further determines whether a non-correctable error exists in rows A0, B0, A0', B0'. For instance, a non-correctable error is a 2-bit error for the Hamming code described hereinabove. If the ECC circuitry 190 determines that one or more rows A0, B0, A0', B0' contain a non-correctable error, the ECC circuitry 190 may retrieve the data word stored in rows A0, B0, A0', B0' from an external source and replace the row that contains a non-correctable error with the retrieved data word. Alternatively, if the ECC circuitry 190 determines that a row contains a non-correctable error, the ECC circuitry 190 may replace the contents of the row containing the non-correctable error based on the contents of the other rows that were determined not to contain errors.

If XOR 170 determines that the two match operations 153, 155 of FIG. 1B have different results and the ECC circuitry 190 determines that none of the rows A0, B0, A0', B0' have an error, the ECC circuitry 190 may retrieve the data word stored in rows A0, B0, A0', B0' from an external source and replace every row A0, B0, A0', B0' with the retrieved data word. The ECC circuitry 190 may determine that none of the rows A0, B0, A0', B0' have an error if any of rows A0, B0, A0', B0' contain a non-detectable error. For instance, a non-detectable error is a 3-bit error for the Hamming code described hereinabove.

The present invention advantageously enables the real-time detection of errors in entries of a TCAM. The use of duplicate data entries 120 allow the detection of errors that otherwise would not be detected in real-time. Additionally, the storage of ECC data 210 within the TCAM enable local correction and/or detection of errors without the need to retrieve the uncorrupted data from an external source. As a result, the error correction and detection features are self contained in a TCAM module without the need of external modules or components.

Figure 3:
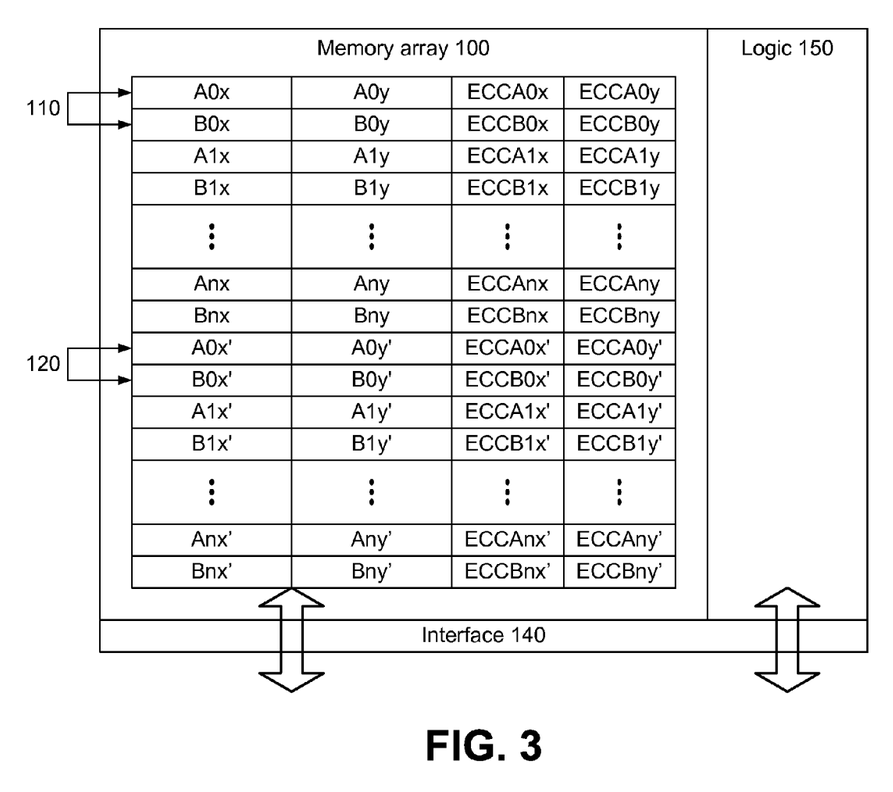
FIG. 3 is a block diagram of a TCAM with sub-divided data entries, according to another embodiment of the invention.

To decrease the likelihood of multiple bit errors, the entries of the TCAM may be divided into multiple segments, as shown in FIG. 3. In this example, each data row is divided into two sub-entries, each associated with its own ECC data. The old data row A0 is divided into sub-entries A0*x* and A0*y*. The ECC code for A0*x* is stored as ECCA0*x*, and the ECC code for A0*y* is stored as ECCA0*y*. By doing this, the TCAM is able to correct single bit errors and detect double bit errors in each sub-entry. Additionally, the bits of the data rows and/or sub-entries may be physically placed in locations that reduce the likelihood of double bit errors.

Figure 4:
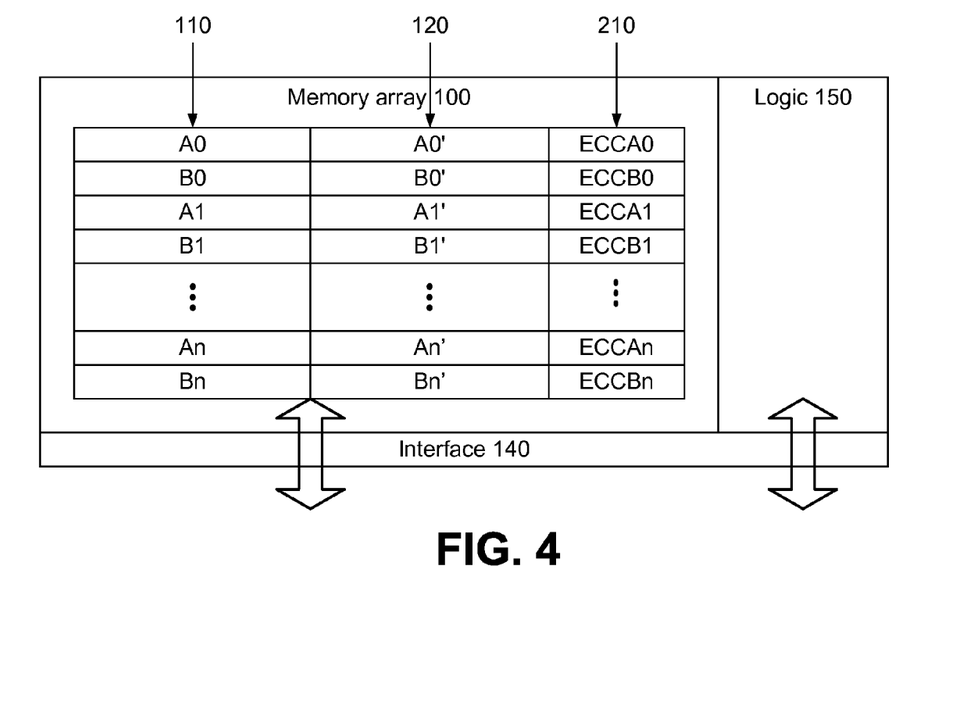
FIG. 4 is a block diagram of a TCAM with shared ECC data, according to another embodiment of the invention.

Other implementations may use other arrangements of duplicate data entries and ECC data internal to the TCAM. For example, FIG. 4 is a block diagram of a TCAM with shared ECC data, according to another embodiment of the invention. In this example, the data entries 110 and their duplicates 120 are stored in the same row. A single ECC data 210 is used for both. In one implementation, ECCA0 is the 9-bit Hamming code for the 144-bits A0. Since A0' is a duplicate of A0 (at least initially, upon writing to the TCAM), the same 9-bit ECCA0 is also the Hamming code for A0'. In an alternate design, A0 and A0' are treated as a single 288-bit word and ECCA0 is the Hamming code for the 288-bit word.

One advantage of implementing the duplicate data entries 120 and/or the ECC data 210 and associated logic circuitry internally to the TCAM is that operations can be done internally within the TCAM, without the overhead of having to cross the interface 140.

In another aspect, TCAMs may be provided as macro blocks for inclusion into larger chip designs. Thus, one company may be designing a chip that requires TCAMs. Instead of designing the TCAMs itself, the company (customer) licenses TCAM macro blocks from an IP vendor. The IP vendor may provide a TCAM macro block that already provides for the duplicate data entries 120 and/or the ECC data 210 and associated logic circuitry. This will save the customer time because he does not have to design these components or integrate them with a TCAM that does not have them. The IP vendor may also be able to come up with better overall designs since he may be able to better integrate the duplicate data entries 120 and/or the ECC data 210 with the rest of the TCAM.

In some embodiments, the IP vendor may provide a TCAM compiler to generate the design of a TCAM based on parameters specified by the customer. For example, the customer may specify the number of bits per word, the number of entries or words in the TCAM, etc. The customer may also specify if error detection and/or correction is desired. The memory compiler then generates the data entries 110, the duplicate data entries 120 and/or the ECC data 210 and associated logic circuitry.

In some implementations of the TCAM, certain logic components may be implemented as macro blocks, which typically are laid out by hand and provided by the IP vendor. Other components may be implemented as a wrapper, which typically is synthesized from RTL and may be provided by either the IP vendor or the customer. For instance, the read/write circuitry 160, the data match module 165, and the XOR 170 often is included as part of a TCAM macro block, while the ECC PE 180 may be included as part of the wrapper. In another example, the ECC 190 may also be included in the wrapper. In yet another example, the read/write circuitry 160, the data match module 165, the XOR 170, the ECC PE 180, and the ECC 190 are all included in the TCAM macro block.

In yet another aspect, the TCAM compiler may generate a single word to store the data entry 110,120 and the ECC data 210. For instance, if the data entry 110,120 is 144-bits long, and the ECC data 210 is 9-bits long, the TCAM compiler may generate a 153-bit long row to store both the data entry 110,120 and the ECC data 210. That is, both row A and row B are increased by the number of bits in the ECC data 210 (e.g., row A and row B are generated as 153-bit long rows).

In some embodiments, to exclude the ECC data 210 from the compare operation, a mask is generated to mask out the bits of the ECC data 210. The mask can be generated internally in the TCAM or external by a wrapper. Alternatively, the TCAM memory elements for the ECC data bits may be modified to remove the ECC data bits from the compare operation. For instance, the bits from the ECC data 210 may be disconnected from the line performing the compare operation of the data entry 110,120, or the ECC data bits may be modified by removing the logic components that perform the compare operation.

In another embodiment, the ECC data 210 may be stored in a word that is separate from the data entries 110,120. For instance, two memory arrays, one 144-bits wide and another 9-bits wide may be included to store the data entries 110,120 and the ECC data 210 respectively. In one embodiment, the memory array storing the ECC data 210 is implemented as an SRAM memory array.

Although the detailed description contains many specifics, these should not be construed as limiting the scope of the invention but merely as illustrating different examples and aspects of the invention. It should be appreciated that the scope of the invention includes other embodiments not discussed in detail above. Various other modifications, changes and variations which will be apparent to those skilled in the art may be made in the arrangement, operation and details of the method and apparatus of the present invention disclosed herein without departing from the spirit and scope of the invention.

What is claimed is:

1. A ternary content addressable memory (TCAM) comprising:
   a memory array configured to store a data entry for a data word and a corresponding duplicate data entry for the data word;
   a data match module configured to compare the data entry to an input word to produce a first match output, the first match output indicative of a match between the data entry and the input word, and to compare the duplicate data entry to the input word to produce a second match output, the second match output indicative of a match between the duplicate data entry and the input word; and
   compare circuitry configured to compare the first match output and the second match output, the compare circuitry configured to output a first value responsive to the first match output having a same value than the second match output, and configured to output a second value responsive to the first match output having a different value than the second match output.

2. The TCAM of claim 1, further comprising:
   error correction code (ECC) circuitry configured to calculate ECC data for the data entry and the duplicate data entry, the ECC data stored in the memory array; and
   the ECC circuitry further configured to apply error correction to the data entry or the duplicate data entry using the ECC data, if the comparison of the first and second match outputs indicates a mismatch between the first and second match outputs.

3. The TCAM of claim 2, wherein if the comparison of the first and second match outputs indicates a mismatch between the first and second match outputs, the ECC circuitry is further configured to:
   determine, based on the ECC data, whether the data entry or the duplicate data entry contains an error; and
   responsive to determining a correctable error, correct the error in the data entry or the duplicate data entry using the ECC data.

4. The TCAM of claim 3, wherein if the comparison of the first and second match outputs indicates a mismatch between the first and second match outputs, the ECC circuitry is further configured to:
   determine, based on the ECC data, whether the data entry or the duplicate data entry contains an error; and
   responsive to determining a non-correctable error, retrieve the data word for the data entry or the duplicate data entry from an external source and replace the data entry or the duplicate data entry with the data word retrieved from the external source.

5. The method of claim 3, wherein if the comparison of the first and second match outputs indicates a mismatch between the first and second match outputs, the ECC circuitry is further configured to:
   determine, based on the ECC data, whether the data entry or the duplicate data entry contains an error; and
   responsive to determining that neither the data entry nor the duplicate data entry contains an error, retrieve the data word for the data entry and the duplicate data entry from an external source and replace the data entry and the duplicate data entry with the data word retrieved from the external source.

6. The TCAM of claim 2, wherein the memory array comprises a plurality of memory rows, and single memory rows store portions of data entries or duplicate data entries, and ECC data corresponding to the stored portions.

7. The TCAM of claim 2, wherein the memory array comprises a plurality of memory rows, and single memory rows store portions of data entries, corresponding portions of duplicate data entries, and ECC data corresponding to the stored portions.

8. The TCAM of claim 2, wherein the ECC circuitry implements a Hamming code.

9. The TCAM of claim 2, wherein the ECC data is sufficient to correct 1-bit errors and to at least detect 2-bit errors.

10. The TCAM of claim 1, wherein the memory array comprises a plurality of memory rows, and a memory row storing the data entry is separated by at least four memory rows from a memory row storing the duplicate data entry.

11. The TCAM of claim 1, wherein the memory array comprises a plurality of memory rows, the data entry is stored in two of the memory rows, and the duplicate data entry is stored in a different two of the memory rows.

12. The TCAM of claim 1, further comprising:
   an interface to the memory array.

13. The TCAM of claim 1, wherein the data entry for the data word contains at least twice as many bits as the data word.

14. The TCAM of claim 1, wherein the data entry for the data word contains data for the data word and a mask for the data word.

15. The TCAM of claim 1, wherein the data entry for the data word contains data for the data word, ECC data for the data word, a mask for the data word, and ECC data for the mask of the data word.

16. A method for detecting, in real-time, possible errors in a content comparison function of a ternary content addressable memory (TCAM), the method comprising the following steps performed within the TCAM:
   receiving an input word;
   comparing the received input word to a data entry storing a data word in the TCAM to produce a first match output, the first match output indicative of a match between the data entry and the input word;

comparing the received input word to a duplicate data entry storing the data word in the TCAM to produce a second match output, the second match output indicative of a match between the duplicate data entry and the input word;

comparing the first match output and the second match output, wherein comparing the first match output and the second match output comprises outputting a first value responsive to the first match output having a same value than the second match output, and outputting a second value responsive to the first match output having a different value than the second match output; and if the comparison of the first match output and the second match output indicates a mismatch between the first match output and the second match output, indicating a possible error in the content comparison function of the TCAM for the data entry or the duplicate data entry.

17. The method of claim 16 further comprising, if the comparison of the first and second match outputs indicates a mismatch between the first and second match outputs:

correcting possible error in the data entry or the duplicate data entry; and responsive to correcting the possible error in the data entry or the duplicate data entry:

comparing the received input word to a data entry storing a data word in the TCAM to produce a first match output, comparing the received input word to a duplicate data entry storing the data word in the TCAM to produce a second match output, and comparing the first and second match outputs.

18. A non-transitory computer readable medium storing instructions for manufacturing a ternary content addressable memory (TCAM), the TCAM comprising:

a memory array configured to store a data entry for a data word and a corresponding duplicate data entry for the data word;

a data match module configured to compare the data entry to an input word to produce a first match output, the first match output indicative of a match between the data entry and the input word, and to compare the duplicate data entry to the input word to produce a second match output, the second match output indicative of a match between the duplicate data entry and the input word; and compare circuitry configured to compare the first match output and the second match output, the compare circuitry configured to output a first value responsive to the first match output having a same value than the second match output, and configured to output a second value responsive to the first match output having a different value than the second match output.

* * * * *